United States Patent [19]

Matsuura

[11] Patent Number: 5,703,404
[45] Date of Patent: Dec. 30, 1997

[54] SEMICONDUCTOR DEVICE COMPRISING AN SIOF INSULATIVE FILM

[75] Inventor: Masazumi Matsuura, Hyogo, Japan

[73] Assignee: Mitsubishi Denki Kabushiki Kaisha, Tokyo, Japan

[21] Appl. No.: 772,953

[22] Filed: Dec. 24, 1996

Related U.S. Application Data

[63] Continuation of Ser. No. 612,716, Mar. 8, 1996, abandoned.

[30] Foreign Application Priority Data

Oct. 23, 1995 [JP] Japan .................. 7-274010

[51] Int. Cl.$^6$ .................................................. H01L 29/80
[52] U.S. Cl. ...................... 257/758; 257/637; 257/650
[58] Field of Search .......................... 257/758–760, 257/635, 637, 638, 644, 650

[56] References Cited

U.S. PATENT DOCUMENTS

| | | | |
|---|---|---|---|
| 5,215,787 | 6/1993 | Homma | 427/248.1 |
| 5,334,552 | 8/1994 | Homma | 437/195 |
| 5,429,995 | 7/1995 | Nishiyama et al. | 437/238 |
| 5,521,424 | 5/1996 | Ueno et al. | 257/760 |

FOREIGN PATENT DOCUMENTS

| | | | |
|---|---|---|---|
| 0 599 730A2 | 6/1994 | European Pat. Off. | |
| 0175635 | 7/1991 | Japan | 257/760 |

OTHER PUBLICATIONS

Usami, Takashi, et al. "Low Dielectric Constant Interlayer..." Jpn. J. Appl. Phys. vol. 33, Jan. 1994 pp. 408–412.

Yeh, Ching–Fa, et al. "The Physicochemical Properties and Growth Mechanism..." J. Electrochem. Soc., vol. 141, No. 11, Nov. 1994, pp. 3177–3181.

Homma et al., "A Room Temperature Chemical Vapor Deposition SiOF Film Formation Technology for the Interlayer in Submicron Multilevel Interconnections" J. Electrochem Soc., vol. 140, No. 3, (Mar. 1993), pp. 687–692.

Gomarasca et al., "Properties of borophosphosilicate glass films deposited by different chemical vapor deposition techniques" J. Vac. Sci. Technol. B 10(2), Mar./Apr. 1992, pp. 633 to 642.

V. L. Shannon[1] et al., "Study of the material poroperties and suitability of plasma–deposited fluorine–doped silicon dioxides for low dielectric constant interlevel dielectrics" Thin Solid Films 270 (1995), 1. 12. 1995, pp. 498–502.

Alonso et al., "Effect of the predecomposition of $SiF_4$ on the properties of silicon dioxide deposited at low temperatures using $SiF_4/SiH_4/N_2O$ in a double–plasma process" J. Vac. Sci. Technol. A 13(2), Mar./Apr. 1995, pp. 244–247.

Matsuura et al., "Novel Self–planarizing CVD Oxide for Interlayer Dielectric Applications" IEDM 94, pp. 117–120.

Shapiro[a] et al., "CVD of fluorosilicate glass for ULSI applications" Thin Solid Films 270 (1995), Dec. 1, 1995, pp. 503–507.

M. Matsuura et al, Novel Self–Planarizing CVD Oxide for Interlayer Dielectric Applications, Technical Digest of IEDM 94, pp. 117–120.

A. Kiermasz et al, Planarisation for Sub–Micron Devices Utilizing a New Chemistry, Proceedings of DUMIC Conference 1995, pp. 94–100.

Tetsuya Homma et al, A Room Temperature Chemical Vapor Deposition SiOF Film Formation Technology for the Interlayer in Submicron Multilevel Interconnections, J. Electrochemical Society, Inc., vol. 140, No. 3, Mar. 1993, pp. 687–692.

*Primary Examiner*—Sara W. Crane
*Attorney, Agent, or Firm*—Lowe, Price, LeBlanc & Becker

[57] ABSTRACT

A semiconductor device having an interlayer insulating film improved to decrease film shrinkage and film stress is provided. Metal interconnections are formed on a substrate. A silicon oxide film is provided on the substrate to cover the metal interconnections and to fill a space between the metal interconnections. The chemical formula of the silicon oxide film contains Si-F bond.

8 Claims, 3 Drawing Sheets

SEMICONDUCTOR DEVICE COMPRISING AN SIOF INSULATIVE FILM

This application is a continuation of application Ser. No. 08/612,716 filed Mar. 8, 1996, now abandoned.

BACKGROUND OF THE INVENTION

1. Field of the Invention

The present invention relates to a semiconductor device. It particularly relates to an improved semiconductor device in which shrinkage of an interlayer insulating film is reduced and film stress is decreased. The present invention also relates to a method of manufacturing such a semiconductor device.

2. Description of the Background Art

A silicon oxide film formed by CVD (Chemical Vapor Deposition) method using silane gas ($SiH_4$) and hydrogen peroxide ($H_2O_2$) is capable of filling a space of as small as 0.25 μm or below between extremely finely-patterned interconnections and also has good fluidity so that it exhibits self-planarizing property. For this reason, this method has been noted as the next-generation method of planarizing an interlayer insulating film in place of the conventionally used SOG (Spin-On Glasses) method. This conventional method is described in detail in a material "Novel Self-Planarizing CVD Oxide for Interlayer Dielectric Applications" (Technical Digest of IEDM 1994) and in another material, "Planarisation for Sub-micron Devices Utilizing a New Chemistry" (Proceedings of DUMIC Conference 1995). The formation reaction of a silicon oxide film according to the conventional method is as shown by the following chemical formulas:

$$SiH_4 + 2H_2O_2 \rightarrow Si(OH)_4 + 2H_2 \quad (1a)$$

$$SiH_4 + 3H_2O_2 \rightarrow Si(OH)_4 + 2H_2O + H_2 \quad (1b)$$

$$SiH_4 + 4H_2O_2 \rightarrow Si(OH)_4 + 4H_2O \quad (1c)$$

$$nSi(OH)_4 \rightarrow nSiO_2 + 2nH_2O \quad (2)$$

Firstly, $SiH_4$ changes to silanol ($Si(OH)_4$) by oxidation reaction of $H_2O_2$ (reaction formulas 1a, 1b, 1c). The silanol thus produced has dehydrating polymerization reaction caused by hydrolysis or thermal energy and changes to silicon oxide ($SiO_2$) (reaction formula (2)). When such a reaction occurs on a substrate, a silicon oxide film serving as an interlayer insulating film will be formed.

A process for forming an interlayer insulating film using the conventional method above will now be described.

Referring to FIG. 6, a substrate 11 is prepared. Substrate 11 includes a silicon substrate, an element formed thereon and an insulating layer (not shown). First and second aluminum interconnections 12a and 12b are formed on substrate 11. A first plasma oxide film 13 is formed to cover the first and second aluminum interconnections 12a and 12b.

Referring to FIG. 7, a silicon oxide film 14 is formed by CVD method using $SiH_4$ and $H_2O_2$. Silicon oxide film 14 fills a space between the first aluminum interconnection 12a and the second aluminum interconnection 12b.

Referring to FIG. 8, a second plasma oxide film 15 is formed on silicon oxide film 14 and a planarized interlayer insulating film 16 is thus completed.

Referring to FIG. 7, silicon oxide film 14 formed by CVD method using $SiH_4$ and $H_2O_2$ is capable of filling the space between extremely finely-patterned interconnections and also realizes good self-planarizing property, since the silanol produced during the film forming process has good fluidity.

Referring to the reaction formula (2) above, however, a great stress is caused in the silicon oxide film due to film shrinkage, since silanol has dehydrating condensation reaction caused during the process in which the silanol changes into silicon oxide. If the stress is too great, a crack occurs in the silicon oxide film itself or reliability of a metal interconnection provided in the underlying layer is adversely affected.

SUMMARY OF THE INVENTION

The present invention is to solve the problems described above. An object of the invention is to provide a semiconductor device which is improved to reduce film stress in a silicon oxide film.

Another object of the present invention is to provide a method of manufacturing such a semiconductor device.

A semiconductor device according to a first aspect of the present invention comprises a substrate. First and second metal interconnections are formed on the substrate. A silicon oxide film is provided on the substrate to cover the first and second metal interconnections and to fill a space between the first metal interconnection and the second metal interconnection. The chemical formula of the silicon oxide film contains Si-F bonds.

In a semiconductor device according to the first aspect of the present invention, since Si-F bonds are introduced into the interlayer insulating film, the SiOH bonds therein are fewer than those contained in a conventional interlayer insulating film. Therefore, the subsequent dehydrating condensation reaction is relaxed, so that film shrinkage is reduced and therefore film stress is decreased. Also, the introduction of Si-F bonds into the interlayer insulating film has further effects that dielectric constant of the interlayer insulating film is decreased and that the residual Si-OH bonds are reduced.

According to a method of manufacturing a semiconductor device according to a second aspect of the present invention, the silicon oxide film is formed by chemical vapor deposition method using a mixed gas of hydrogen peroxide and raw material gas having a silicon atom binding with a fluorine atom. Accordingly, Si-F bonds are introduced into the interlayer insulating film produced. As a result, Si-OH bonds contained in the silanol are fewer when compared with a conventional method. Therefore, the subsequent dehydrating condensation reaction is relaxed and film shrinkage is reduced, thereby providing an interlayer insulating film with reduced film stress.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to the figures hereinafter.

[First Embodiment]

Figure 1:
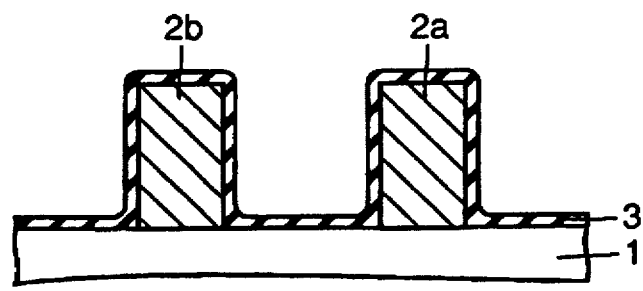
FIGS. 1–3 are cross sectional views of a semiconductor device in the first to third steps of a method of manufacturing a semiconductor device according to a first embodiment of the present invention, respectively.
Figure 2:
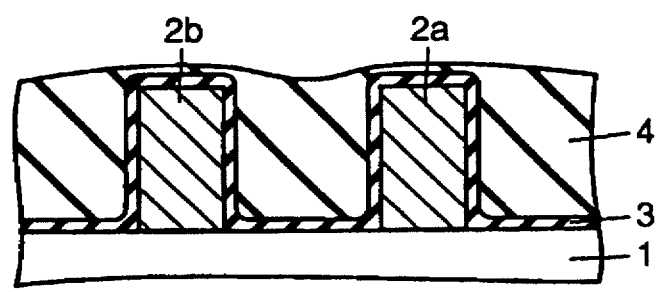

Referring to FIG. 1, first and second aluminum interconnections 2a and 2b are formed on a substrate 1. A first plasma oxide film 3 is formed on substrate 1 to cover the first and second aluminum interconnections 2a and 2b. The first plasma oxide film 3 is formed by plasma CVD method. General conditions for forming the first plasma oxide film 3 are as follows: a forming temperature of 300° C., a pressure of 750 mTorr, high frequency power of 500 W and raw material gases of $SiH_4$ and nitrous oxide ($N_2O$). The thickness of the first plasma oxide film 3 formed is 1000 Å. It may also be formed by CVD method using TEOS (Tetra ethoxy silane) and oxygen as the raw material gas (in which case, preferably, the forming temperature is 400° C., the pressure is 5 Torr and the high frequency power is 500 W). Referring to FIG. 2, a silicon oxide film (referred to as "HSO film" hereinafter) 4 is formed on the first plasma oxide film 3 by CVD method using $SiH_4$ and $H_2O_2$. A characteristic of the present embodiment lies in a method of forming HSO film 4. Specifically, the embodiment is characterized by addition of fluorosilane ($SiH_x F_{4-x}$) to $SiH_4$. Fluorosilane only can be used as a raw material gas. The fluorosilane used in the present embodiment is difluorosilane ($SiH_2F_2$). Typical conditions for forming the HSO film are as follows:

forming temperature: 1° C. (preferably within a range of −10° C. to 100° C.)

forming pressure: 850 mTorr (preferably within a range of 200 mTorr to 600 Torr)

gas flow: $SiH_4$ 40 SCCM (standard cubic centimeter per minute)

$SiH_2F_2$: 40 SCCM $N_2$: 500 SCCM $H_2O_2$: 0.65 g/min.

When the forming temperature is 100° C. or above, granules are produced and no film is formed. When the forming pressure exceeds 600 Torr, granules are produced and no film is formed.

Figure 4:
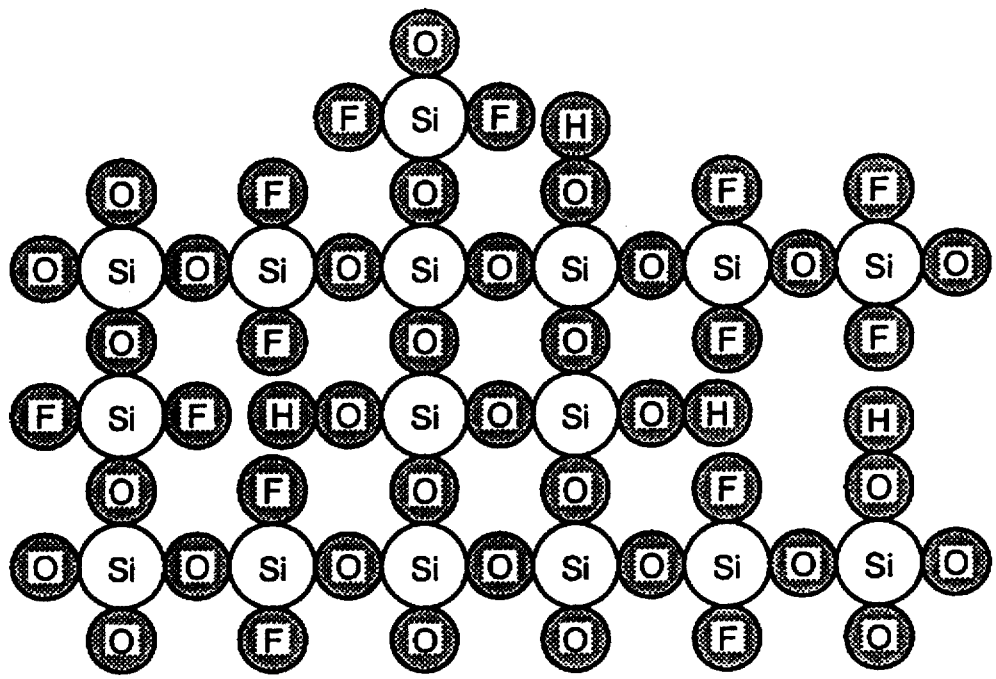
FIG. 4 shows the chemical formula of the silicon oxide film formed in the first embodiment of the present invention.

The silicon oxide film formed under the above conditions has the chemical formula diagrammatically shown in FIG. 4. As is apparent from FIG. 2, when $SiH_4$ and $SiH_2F_2$ are used, the chemical formula of the silicon oxide film has the unit shown below, that is, a unit having first and second silicon atoms binding with each other by an oxygen atom, the first silicon atom further binding with three oxygen atoms and the second silicon atom binding with two fluorine atoms:

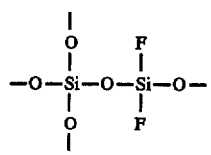

Figure 5:
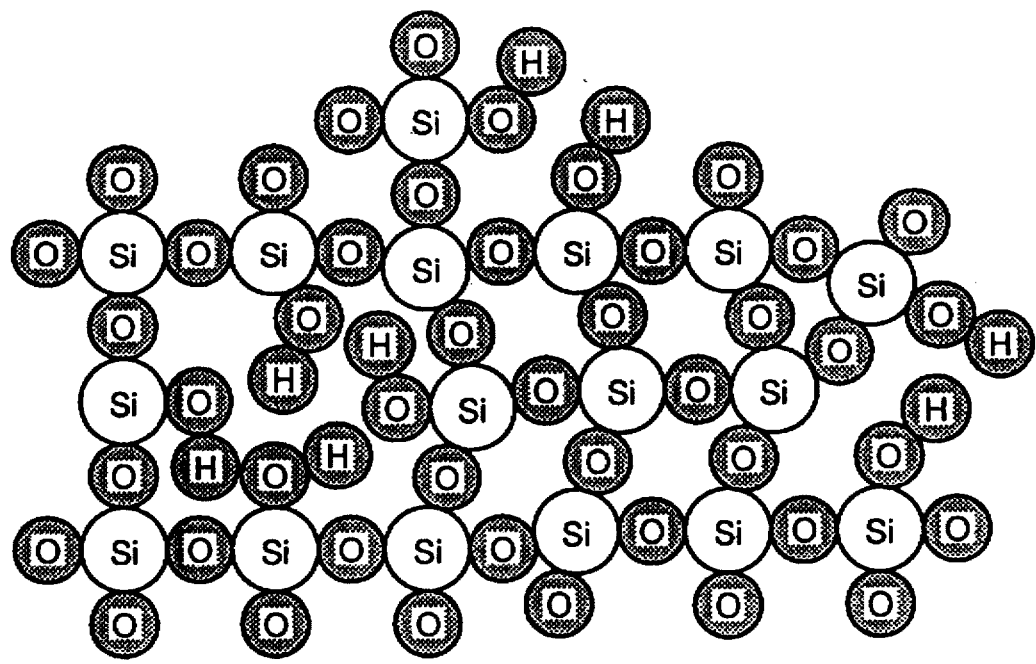
FIG. 5 shows the chemical formula of an interlayer insulating film formed by a conventional method.
Figure 6:
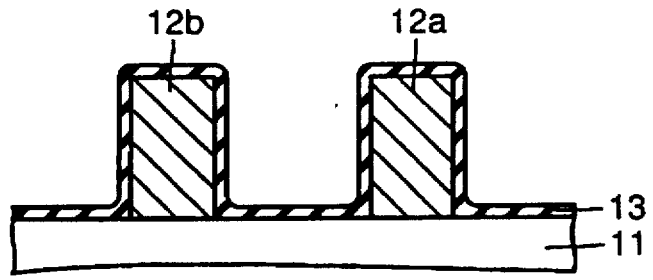
FIGS. 6–8 are cross sectional views of a semiconductor device in the first to third steps of a conventional method of manufacturing a semiconductor device, respectively.
Figure 7:
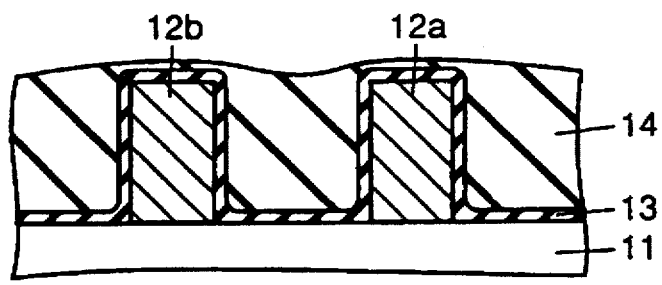
Figure 8:
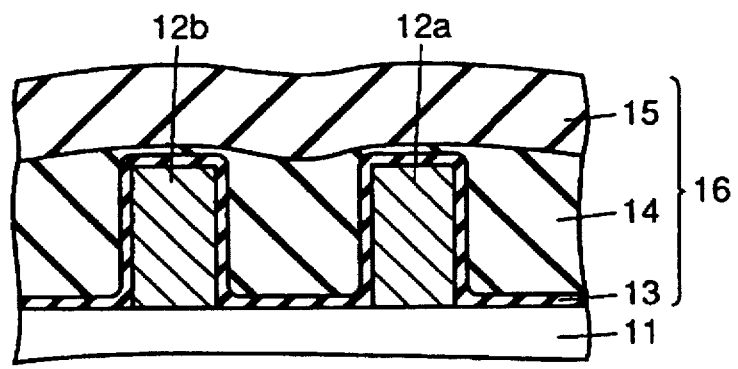

For comparison, the molecular structure of a silicon oxide film formed by a conventional method (CVD method using $SiH_4$ and $H_2O_2$) is shown in FIG. 5. The silicon oxide film formed by the conventional method is structured by Si-O bonds and Si-OH bonds. On the other hand, the silicon oxide film of the present embodiment is structured by Si-O bonds, Si-F bonds and Si-OH bonds. When the gas system described above is used, the silanol produced consists of 75% Si-OH bonds and 25% Si-F bonds. Since an Si-F bond is very stable under the film forming condition described above, it is taken into the silicon oxide film as it is. On the other hand, when the raw material gas is 100% $SiH_4$, that is, when $SiH_4$ is 80 SCCM, the silanol produced consists of 100% Si-OH bonds. Accordingly, the silicon oxide film of the present embodiment has fewer Si-OH bonds contained in the silanol produced in the film forming process when compared with those produced by the conventional method, so that the subsequent dehydrating condensation reaction is relaxed. Thus, film shrinkage is reduced and hence film stress is relaxed.

Furthermore, the introduction of Si-F bonds into the film has effects that dielectric constant of the film is decreased and that the residual Si-OH bonds are reduced.

Figure 3:
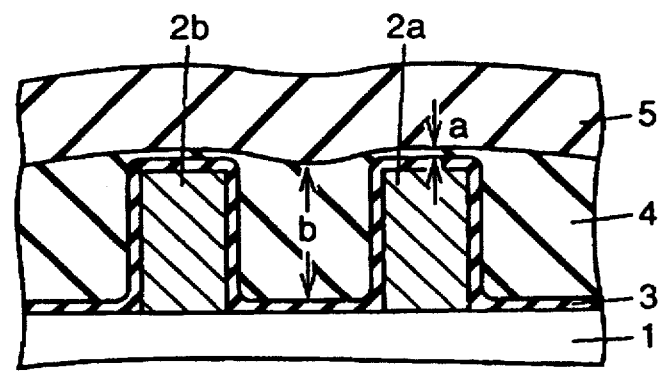

Referring to FIG. 3, a second plasma oxide film 5 is formed on HSO film 4. Conditions for forming the second plasma oxide film 5 may or may not be the same as those for forming the first plasma oxide film 3. Even if the conditions are different, they would not affect effects brought about by the present embodiment.

The semiconductor device is completed when an additional aluminum interconnection is formed on the second plasma oxide film 5, although it is not shown in the figures.

According to the present embodiment, the inequality a<b is established, wherein a represents the thickness of the HSO film 4 over the first and second aluminum interconnections 2a and 2b, and b represents the thickness of HSO film 4 lying on substrate 1 and lying between the first aluminum interconnection 2a and the second aluminum interconnection 2b.

Furthermore, if $PH_3$ or $B_2H_6$ is injected into the raw material gas when forming HSO film 4, a silicon oxide film doped with boron ions or phosphorus ions is obtained. When boron ions or phosphorus ions are implanted, gettering effect is produced.

Preferably, the amount of boron ions or phosphorus ions to be implanted is 5 to 10 mol %.

[Second Embodiment]

In the first embodiment of the present invention, an example in which $SiH_2F_2$ is used as fluorosilane is illustrated. However, the present invention is not limited to this example and use of trifluorosilane ($SiHF_3$) and monofluorosilane ($SiH_3F$) brings about a similar effect.

When trifluorosilane is used for fluorosilane, the typical chemical formula of the silicon oxide film obtained has the following unit:

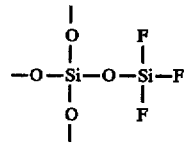

When monofluorosilane is used for fluorosilane, the chemical formula of the interlayer insulating film obtained has the following unit:

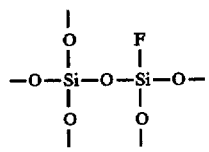

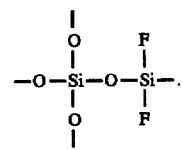

[Third Embodiment]

While an example in which fluorosilane is used as a silicon compound is illustrated in the above embodiments, a similar effect can be realized even when an organosilicon compound containing an organic group (alkyl group), typically TEFS (Triethoxy fluorosilane), is used.

In that case, referring to FIG. 3, the thickness of the interlayer insulating film will satisfy the relation a=b.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a substrate;
   first and second metal interconnections formed on said substrate; and
   a silicon oxide film formed on said substrate, and covering said first and second metal interconnections and filling a space between said first metal interconnection and said second metal interconnection,
   wherein the chemical formula of said silicon oxide film contains the following chemical structure unit.

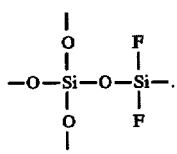

2. The semiconductor device according to claim 1, wherein
the chemical formula of said silicon oxide film contains the following unit.

3. The semiconductor device according to claim 1, wherein an inequality a<b is established, wherein a represents that thickness of said silicon oxide film lying on said first and second metal interconnections and b represents that thickness of said silicon oxide film lying on said substrate and lying between said first metal interconnection and said second metal interconnection.

4. The semiconductor device according to claim 1, wherein said silicon oxide film contains boron atoms or phosphorus atoms.

5. The semiconductor device according to claim 1, wherein said boron atoms or said phosphorus atoms are contained by five to ten mol %.

6. The semiconductor device according to claim 1, further comprising a plasma oxide film covering said first and second interconnections.

7. The semiconductor device according to claim 1, wherein
the chemical formula of said silicon oxide film contains the following unit.

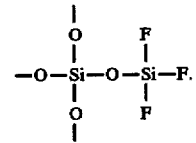

8. The semiconductor device according to claim 1,
said chemical structure units are uniformly distributed in said silicon oxide film.

* * * * *